United States Patent [19]

Fordham

[11] 4,321,647

[45] Mar. 23, 1982

[54] OVERCURRENT RELAYS

[75] Inventor: Roger G. Fordham, Stafford, England

[73] Assignee: The General Electric Company Limited, London, England

[21] Appl. No.: 62,998

[22] Filed: Aug. 2, 1979

[51] Int. Cl.³ .......................................... H02H 3/093
[52] U.S. Cl. ...................................... 361/97; 361/94; 364/483
[58] Field of Search ................... 361/93, 94, 96, 97, 361/100; 340/664, 658; 324/117 R, 117 H, 127; 364/483, 487; 307/87, 233 R

[56] References Cited

U.S. PATENT DOCUMENTS

| | | | |
|---|---|---|---|
| 3,599,045 | 8/1971 | Farinas | 340/658 X |
| 3,656,026 | 4/1972 | Zocholl | 361/97 |
| 3,885,199 | 5/1975 | Nohara et al. | 364/483 X |
| 3,914,667 | 10/1975 | Waldron | 361/94 |
| 3,922,587 | 11/1975 | Jones | 361/159 |
| 3,938,007 | 2/1976 | Boniger et al. | 361/94 X |
| 4,017,766 | 4/1977 | Vercelloti et al. | 361/96 X |
| 4,231,029 | 10/1980 | Johnston | 340/658 |

*Primary Examiner*—Reinhard J. Eisenzopf
*Attorney, Agent, or Firm*—Kirschstein, Kirschstein, Ottinger & Cobrin

[57] ABSTRACT

A time relay comprising a device (1) arranged to produce an output (F) having a frequency representative of a parameter (I) to be monitored, a comparator (5) responsive to the output (F) for producing an output (IN) when the value of the monitored parameter exceeds a setting value, and relay operating circuitry for operating the relay when the comparator produces an output for a time determined by the relay characteristic for the value of the monitored parameter. The device is suitably a Carrier Domain Magnetometer (C.D.M.) and the operating circuitry suitably includes a digitally addressable memory (8) in which the relay characteristic is stored.

8 Claims, 2 Drawing Figures

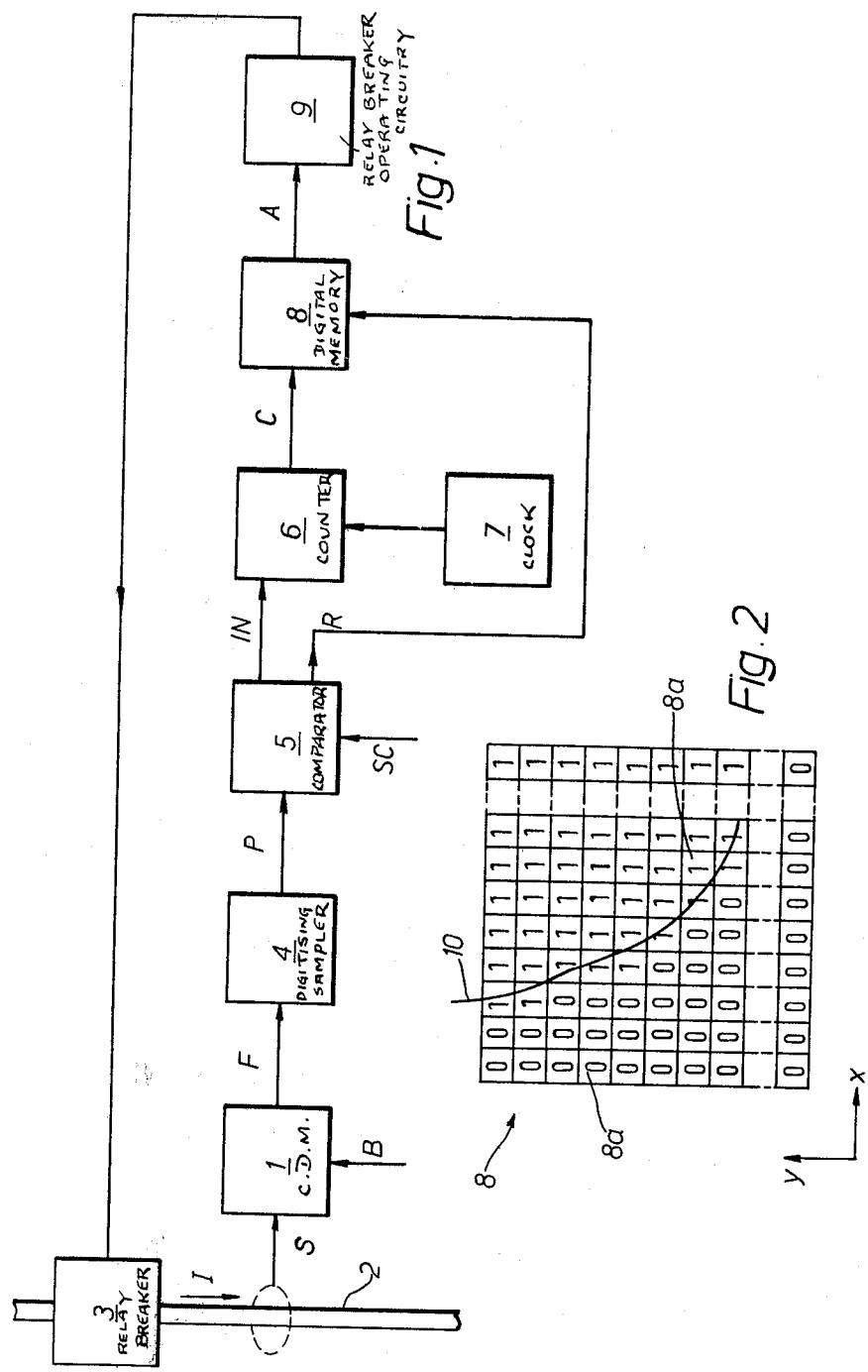

OVERCURRENT RELAYS

This invention relates to time relays.

The invention provides a time relay suitable for making use of a Carrier Domain Magnetometer (C.D.M.) for sensing the parameter to be monitored by the relay.

A C.D.M. is a semi-conductor device in which a current carrying part (the domain) is caused to rotate by the application of a magnetic field at a rate dependent upon the magnetic flux density and applied voltages and currents, thereby to produce an output whose frequency is representative of the magnetic flux density and the applied voltages and currents. The generic name used for such a structure herein is a Carrier Domain Magnetometer (C.D.M.), but it has also been referred to in published work as a Carrier Domain Device (C.D.D.) (Cf. Gilbert B. Electronics Letters, 1976, 12, pp 608–610, and Manley, M. H. et al. Electronics Letters, 1976, 12, pp 610–611).

A C.D.M. may be fabricated by a conventional bipolar process and can be integrated on-chip with ancillary circuits. In a particular example it consists of an extended bipolar structure designed so that only a small part of it (the "domain") is conducting at any given time. The domain forms spontaneously by virtue of positive feedback between a circular npn and a circular pnp transistor. The domain position is sensed by several contacts located around the collector region of one transistor. A magnetic field applied normally to the device causes Lorentz forces to act on the carriers flowing in each transistor. The effect of this magnetic interaction is that a circumferential shift is inserted into the feedback loop enclosing the two transistors, causing the domain to rotate continuously around the device. The sense of rotation corresponds to the field polarity and the frequency of rotation is proportional to the magnitude of the normal magnetic flux density and the applied voltages and currents. In currently available devices there exists a lower threshold limit of magnetic field below which the domain "sticks" at some inhomogeneity within the device. It is also probable that an upper limit exists, possibly related to the transition frequency $f_T$ of the slowest transistor, but experience of such a limit has not yet been reported.

According to the invention a time relay comprises a device arranged to produce an output having a frequency representative of a parameter to be monitored; comparator means responsive to the output of said device for producing an output when the value of the monitored parameter exceeds a setting value; and operating means for operating the relay when the comparator means produces an output for a time determined by the relay characteristic for the value of the monitored parameter.

Preferably said device is a Carrier Domain Magnetometer (C.D.M.).

Preferably the operating means includes a memory in which the relay characteristic is stored.

The memory may comprise an array of memory elements each addressable by an address comprising a digital quantity representative of the value of the monitored parameter, and each memory element containing a value representative of the relay operate time for the value of the monitored parameter of which its address is representative.

Alternatively the memory may preferably comprise an array of memory elements each addressable by a two-part address, one part of which comprises a digital quantity representative of the value of the monitored parameter and the other part of which comprises a digital quantity representative of the time elapsed since the comparator means produced an output, and each memory element containing either an "operate" instruction or a "not operate" instruction such that for any value of the monitored parameter an "operate" instruction is addressed only when the elapsed time is greater than or equal to the time determined by the relay characteristic for that value of the monitored parameter.

In such a relay for use in monitoring an alternating parameter the comparator means preferably includes sampling means for producing a digital quantity representative of the peak value of the frequency of the output of the C.D.M. during each half cycle of the monitored parameter. Preferably the comparator means further includes means responsive to the digital quantity representative of the peak value for producing a digital quantity representative of the ratio of the value of the monitored parameter to the setting value of the monitored parameter.

Preferably the operating means includes a clocked counter arranged to be initiated by the output of the comparator means so as to produce a digital quantity representative of the time elapsed since the comparator means produced an output. Preferably the rate at which the counter is clocked is adjustable so as to allow the relay characteristic to be altered.

The monitored parameter may be the current in a conductor.

One time overcurrent relay in accordance with the invention will now be described, by way of example only, with reference to the accompanying drawings, in which:

FIG. 1 is a schematic block diagram showing the components of the relay; and

FIG. 2 is a schematic diagram of the memory used in the relay.

Referring firstly to FIG. 1 a Carrier Domain Magnetometer (C.D.M.) 1 is suitably biassed with magnetic flux, current and voltage inputs shown collectively as B. The C.D.M. 1 is also arranged so as to be subjected to the magnetic field, shown as S, of a conductor 2 carrying an alternating current I. The relay breaker 3 is connected in series with the conductor 2. The output F of the C.D.M. 1 is applied to a peak detecting and digitising sampler 4.

The peak value digital quantity P produced by the sampler 4 is applied to a comparator 5. A digital quantity SC representative of the desired setting current of the relay is also applied to the comparator 5. The comparator produces an output signal IN when the quantity P is greater than the quantity SC and also produces a digital quantity R representative of the quantity P/SC.

The signal IN is applied to initiate a counter 6 driven by a clock 7. The digital count C of the counter and the digital quantity R are used as the two parts of a two-part address to access instructions stored in a memory 8 which will be described in greater detail below. The accessed instructions A are applied to relay breaker operating circuitry 9 which operates the relay breaker 3 when the appropriate instruction is called from the memory 8.

It will be appreciated that the output F of the C.D.M 1 is a train of pulses whose frequency is representative of the current I in the conductor 2. The sampler 4 counts the number of pulses in successive small periods and corrects each count for bias contributions by subtracting from each count a number commensurate with the contribution of the C.D.M. bias inputs B to the C.D.M. output frequency. The corrected count of greatest magnitude in each half cycle of the current I (which count is representative of the peak value and therefore also of the R.M.S. value of the current I) is applied as the output P of the sampler 4 to the comparator 5.

The comparator 5 compares each peak value digital quantity P with a digital quantity SC representative of the desired setting current of the relay: the value of SC is equal to the value that P would have if the current I in the conductor 2 were equal to the setting current of the relay. The comparator 5 produces the output signal IN when the quantity P is greater than the quantity SC and also outputs the digital quantity R, representative of the ratio of the quantity P to the quantity SC.

The signal IN initiates the counter 6 driven by clock 7. The digital count C of the counter is thus representative of the time which has elapsed since the current I in the conductor 2 exceeded the setting current. The digital quantities R and C are applied to the memory 8, where they are used as the two parts of a two-part address to access from the memory instructions for operation of the relay breaker 3.

Referring now also to FIG. 2, the memory 8 is a pre-programmed ROM comprising a rectangular array of memory elements 8a. Each memory element is arranged to be addressed by a two-part address, one part (the digital quantity R) determining the memory element location in the X direction and the other part (the digital quantity C) determining the memory element location in the Y direction. The memory 8 is preprogrammed such that each memory element contains an "operate" instruction or a "not operate" instruction in the form of a "1" and a "0" respectively. These instructions ("1"'s and "0"'s) are pre-programmed into the memory in accordance with the desired relay characteristic (represented graphically by the curve 10 superimposed on the array of memory elements 8a) so that a "0" is contained in each memory element whose address lies below the desired characteristic curve 10 and a "1" is contained in each memory element whose address lies on or above the desired characteristic curve 10.

The instructions ("1"'s and "0"'s) accessed from the memory 8 in this way (shown as A in FIG. 1) are applied to the relay breaker operating circuitry 9 which controls the operation of the relay breaker 3.

Thus the relay operates in the following manner. When the current I in the conductor 2 exceeds the setting current, the counter 6 begins to count. The digital count C of the counter (representative of the time for which the overcurrent has been occurring) is applied to the memory 8 together with the digital quantity R (representative of the current I) every half cycle of the current I. The magnitude of the overcurrent determines the column of the memory from which instructions will be accessed, a greater magnitude denoting a column further to the right. The count of the counter 6 determines which element of that column will be accessed, a higher count denoting an element further up the column. Thus while the overcurrent has occurred for less than the time determined by the relay characteristic for that overcurrent, only "0"'s will be accessed and applied to the relay breaker operating circuitry 9 and the relay breaker 3 will not be operated. When, however, the overcurrent has occurred for a time equal to or greater than the time determined by the relay characteristic for that overcurrent, "1"'s will be accessed and applied to the relay breaker operating circuitry 9 and the relay breaker 3 will be operated.

It will be appreciated that the relay may be made to operate to a different characteristic simply by changing or re-programming the memory 8 to the desired characteristic.

It will also be appreciated that where it is desired to adjust the characteristic from a preprogrammed form, e.g. where it is desired to grade the characteristics of a number of relays connected at different positions along the same conductor, this may be readily achieved by adjusting the rate of the clock 7.

It will be further appreciated that although the embodiment of the invention described above employs a particular type of memory, in a relay according to the invention in which the relay characteristic is stored in a memory, the memory may be in one of many forms. In another embodiment of the invention, the memory may be in the form of a "look-up table". In such an embodiment each overcurrent value of the digital quantity R addresses a memory element containing a value representative of the time determined by the relay characteristic for that particular overcurrent, and the accessed value is compared with the count C to provide a "not operate" signal if C is less than the accessed value or an "operate" signal if C is equal to or greater than the accessed value.

In another embodiment of the invention the memory may be in the form of a calculator programmed to calculate the relay operate time for any given overcurrent value. In another embodiment the memory may be of an analogue type, e.g. a capacitor discharge circuit arrangement.

It will be further appreciated that although the embodiment of the invention described herein is an overcurrent time relay, the invention is more generally applicable to any time relay wherein the monitored parameter may be monitored using a C.D.M., e.g. power time relays and voltage time relays, etc.

I claim:

1. A time relay comprising: a device arranged to produce an output having a frequency representative of the instantaneous value of a signal to be monitored by the relay; sampling means responsive to the output of said device for producing a first digital quantity representative of said value at a particular time; comparator means responsive to said first digital quantity to produce an output when said first digital quantity exceeds a predetermined digital quantity; timing means responsive to the output of the comparator to produce a second digital quantity representative of the time elapsed since the comparator means produced an output; and operating means responsive to said first digital quantity and said second digital quantity to operate the relay when the elapsed time exceeds a value dependent on the value of the monitored signal represented by said first digital quantity.

2. A relay according to claim 1 wherein said device is a carrier domain magnetometer.

3. A relay according to claim 1 wherein said operating means includes a memory comprising an array of memory elements each addressable by an address corresponding to said first digital quantity, each memory element containing a value representative of the relay operate time for the value of the monitored signal of which its address is representative.

4. A relay according to claim 1 wherein said operating means includes a memory comprising an array of memory elements each addressable by a two-part address, one part of which corresponds to said first digital quantity and the other part of which corresponds to said second digital quantity, each memory element containing either an "operate" instruction or a "not operate" instruction such that an "operate" instruction is addressed only when the elapsed time exceeds a value dependent on the value of the monitored signal represented by said first digital quantity.

5. A relay according to claim 4 wherein the timing means includes a clocked counter whose close rate is adjustable so as to allow the relation between the elapsed time at which the relay operates and the value of the monitored signal represented by said first digital quantity to be varied.

6. A relay according to claim 1 for use in monitoring an alternating signal wherein said first digital quantity is representative of the peak value of the frequency of the output of the device during each half cycle of the monitored signal.

7. A relay according to claim 6 wherein said operating means is responsive to a signal representative of the ratio of said first digital quantity and said predetermined digital quantity.

8. A relay according to claim 1 wherein the monitored signal is the current in a conductor.

* * * * *

UNITED STATES PATENT AND TRADEMARK OFFICE
CERTIFICATE OF CORRECTION

PATENT NO. : 4,321,647
DATED : March 23, 1982
INVENTOR(S) : Roger G. Fordham

It is certified that error appears in the above-identified patent and that said Letters Patent are hereby corrected as shown below:

On the title page add the following:
[30] Foreign Application Priority Data
August 9th, 1978 Great Britain 32685/78

*Signed and Sealed this*

*Fourteenth* Day of *September 1982*

[SEAL]

*Attest:*

GERALD J. MOSSINGHOFF

*Attesting Officer*     *Commissioner of Patents and Trademarks*